(12) United States Patent
Lee et al.

(10) Patent No.: US 9,099,348 B2
(45) Date of Patent: Aug. 4, 2015

(54) SEMICONDUCTOR DEVICE AND METHOD OF MANUFACTURING THE SAME

(75) Inventors: Ki Hong Lee, Suwon-si (KR); Seung Ho Pyi, Yongin-si (KR); Hyun Soo Shon, Suwon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 230 days.

(21) Appl. No.: 13/602,038

(22) Filed: Aug. 31, 2012

(65) Prior Publication Data

US 2013/0193503 A1    Aug. 1, 2013

(30) Foreign Application Priority Data

Feb. 1, 2012    (KR) .......................... 10-2012-0010431

(51) Int. Cl.
*H01L 29/76*    (2006.01)
*H01L 27/115*    (2006.01)

(52) U.S. Cl.
CPC .... *H01L 27/11582* (2013.01); *H01L 27/11573* (2013.01)

(58) Field of Classification Search
CPC ................... H01L 27/11573; H01L 27/11578; H01L 27/1158; H01L 27/11582
USPC ............ 257/314, E21.423, E29.309; 438/268
See application file for complete search history.

(56) References Cited

U.S. PATENT DOCUMENTS

2010/0327339 A1    12/2010    Tanaka et al.
2013/0207182 A1*   8/2013    Lee et al. ...................... 257/329

* cited by examiner

*Primary Examiner* — Shaun Campbell
(74) *Attorney, Agent, or Firm* — William Park & Associates Ltd.

(57) ABSTRACT

A semiconductor device includes: vertical channel layers; a pipe channel layer configured to connect lower ends of the vertical channel layers; and a pipe gate surrounding the pipe channel layer and including a first region, which is in contact with the pipe channel layer and includes a first-type impurity, and remaining second regions including a second-type impurity different from the first type impurity.

13 Claims, 8 Drawing Sheets

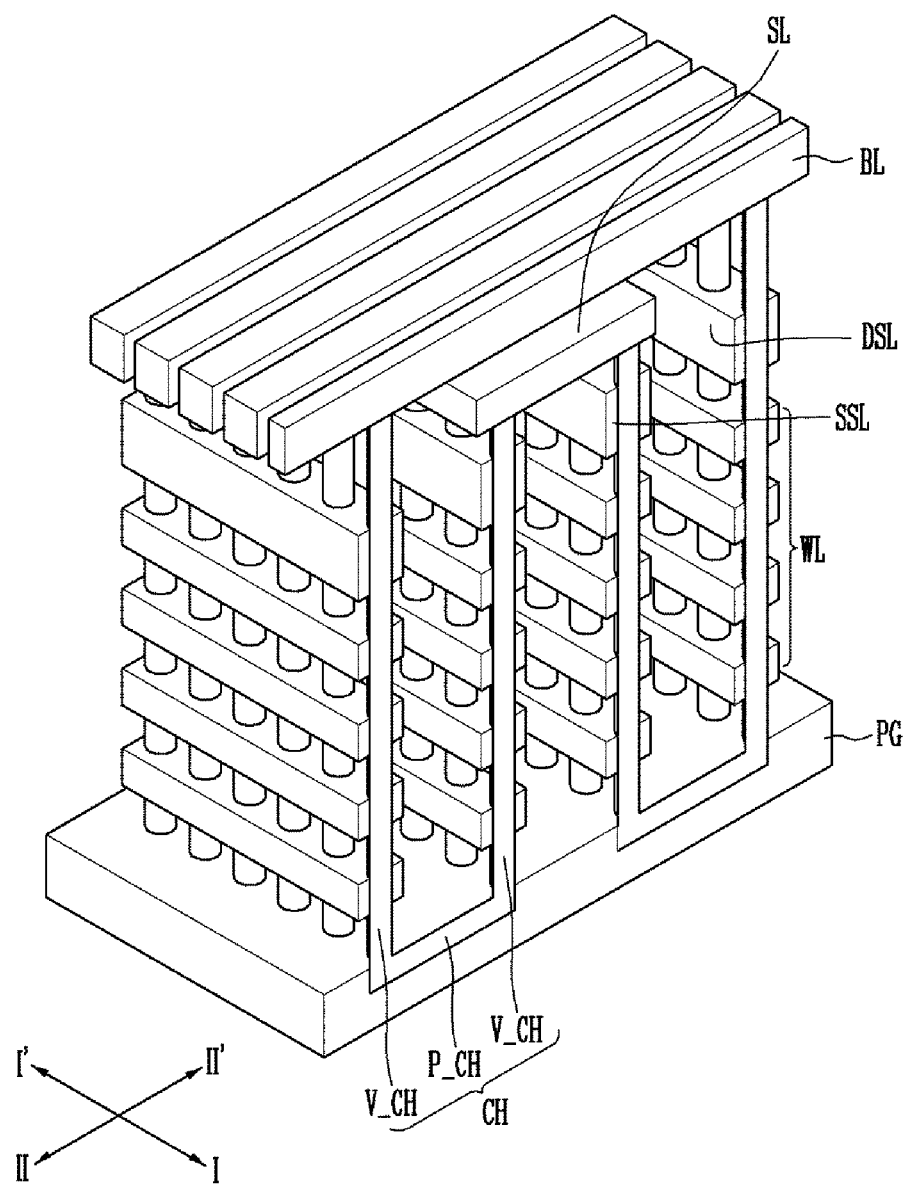

SEMICONDUCTOR DEVICE AND METHOD OF MANUFACTURING THE SAME

CROSS-REFERENCE TO RELATED APPLICATIONS

This application is based on and claims priority under 35 U.S.C. 119(a) to Korean Patent Application No. 10-2012-0010431, filed on Feb. 1, 2012, with the Korean Intellectual Property Office, the disclosure of which is incorporated by reference herein in its entirety.

BACKGROUND

1. Field of the Invention

The present invention relates to a semiconductor device and a method of manufacturing the semiconductor device, and more particularly to a 3D non-volatile memory device including a pipe gate and a method of manufacturing the 3D non-volatile memory device.

2. Description of the Related Art

A non-volatile memory device is a memory device in which stored data is maintained even if power supply is interrupted. As the integration of memory devices having a 2-dimensional structure in which a single layer memory device is formed on a silicon substrate reaches a limit, a 3-Dimensional (3D) non-volatile memory device in which memory cells are vertically stacked on a silicon substrate has been suggested.

Hereinafter, a structure of the 3D non-volatile memory device in the related art and problems associated with the 3D non-volatile memory device will be described in detail with reference to the drawing.

FIG. 1 is a perspective view illustrating a structure of the 3D non-volatile memory device in the related art. For ease of description, interlayer insulating layers are omitted in the drawing.

As illustrated in FIG. 1, the 3D non-volatile memory device in the related art includes a channel layer CH including a pipe channel layer P_CH buried in a pipe gate PG and a pair of vertical channel layers V_CH connected with the pipe channel layer P_CH. Further, the memory device includes word lines WL stacked while surrounding the vertical channel layers V_CH, and a source selection line SSL and a drain selection line DSL stacked on the word lines WL. Strings adjacent in a second direction II-II' (of a first I-I' and second II-II' direction) are commonly connected to one source line SL, and the strings included in a string row extended in the second direction II-II' are commonly connected to one bit line BL.

Here, the channel layer CH is enclosed by a memory layer (not shown). The memory layer includes a tunnel insulating layer, a charge trap layer, and a charge blocking layer. Further, the pipe gate PG is formed of a poly silicon layer including an N-type of impurity.

However, since the N-type poly silicon layer is formed of a material having a small work function, a problem may occur in that charge trapped in a gate insulating layer of a pipe transistor in an erase operation is generated. Especially, because of charge trapped in the charge trap layer among the gate insulating layers, a threshold voltage of the pipe transistor is increased, and thus a cell current is decreased, thereby causing a deterioration of a characteristic of the memory device.

SUMMARY

The present invention has been made in an effort to provide a semiconductor device appropriate for increasing a cell current of a pipe transistor and a method of manufacturing the semiconductor device.

An example embodiment of the present invention provides a semiconductor device including: vertical channel layers; a pipe channel layer configured to connect lower ends of the vertical channel layers; and a pipe gate surrounding the pipe channel layer and including a first region, which is in contact with the pipe channel layer and includes a first-type impurity, and remaining second regions including a second-type impurity different from the first type impurity.

Another example embodiment of the present invention provides a method of manufacturing a semiconductor device, including: forming a pipe gate including a trench filled with a sacrificial layer and including a first region, which is in contact with the trench and includes a first-type impurity, and remaining second regions having a second-type impurity different from the first type impurity; alternately forming first material layers and second material layers on the pipe gate; forming channel holes connected to the trench by etching the first material layers and the second material layers; removing the sacrificial layer exposed in lower surfaces of the channel holes; forming a memory layer along inner surfaces of the trench and the channel holes; and forming a channel layer on the memory layer.

According to the example embodiments of the present invention, the semiconductor device includes the pipe gate including the first region including the first-type impurity and the second region including the second-type impurity.

As described above, the present invention includes the hybrid-type pipe gate, so that it is possible to prevent a threshold voltage from being increased due to the trap of the charge in the gate insulating layer of the pipe transistor in an erase operation.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 1 is a perspective view illustrating a structure of a 3D non-volatile memory device in the related art.

DETAILED DESCRIPTION

Figure 2A:
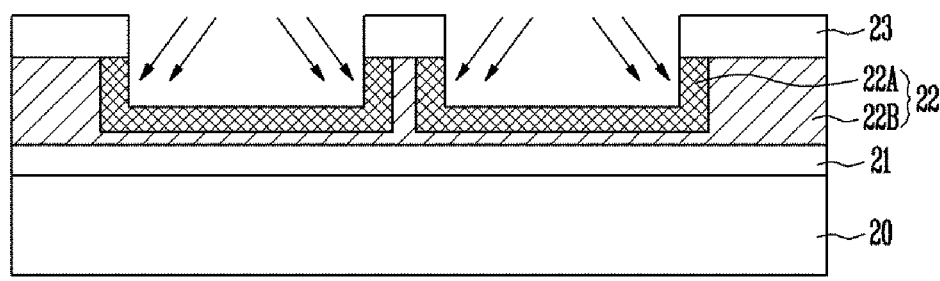
FIGS. 2A, 2B, 3A, 3B, 4A, 4B, 5A, 5B, 6A, 6B, 7A and 7B are cross-sectional views illustrating a method of manufacturing a semiconductor device according to a first embodiment of the present invention.

Hereinafter, examples embodiment of the present invention will be described with reference to the accompanying drawings. In the drawings, a thicknesses and an interval of elements are exaggerated compared to an actual physical thickness and interval for convenience of illustration. In the following description, detailed explanation of known related functions and constitutions may be omitted to avoid unnecessarily obscuring the subject manner of the present invention. Like reference numerals indicate like elements throughout the specification and drawings.

A semiconductor device according to an example embodiment of the present invention includes a pipe gate surrounding a pipe channel layer. Here, the pipe gate includes a first region including a first-type impurity contacting a pipe channel layer and a second region including a second-type impurity different from the first-type impurity. As described above, the pipe gate PG in a hybrid structure having different work functions depending on the region is formed, so that it is possible to prevent an increase in a threshold voltage according to the trapping of a charge in a gate insulating layer of a pipe transistor in an erase operation.

FIGS. 2A to 7B are cross-sectional views illustrating a process of a method of manufacturing a semiconductor device according to a first embodiment of the present invention.

FIGS. 2A, 3A, 4A, 5A, 6A and 7A illustrate cell regions and FIGS. 2B, 3B, 4B, 5B, 6B and 7B illustrate peripheral circuit regions.

Figure 2B:
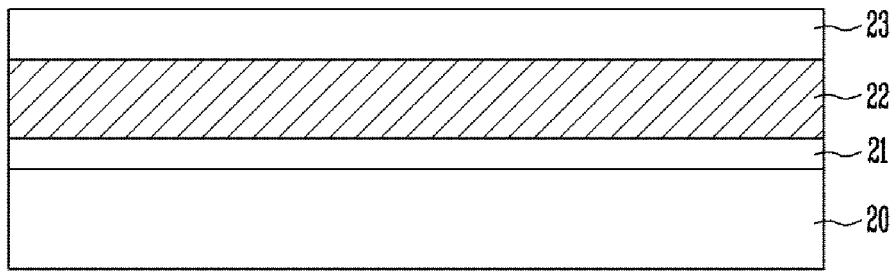

As illustrated in FIGS. 2A and 2B, an insulating layer 21 is formed on a substrate 20 including a cell region (see FIG. 2A) and a peripheral circuit region (see FIG. 2B). Here, the insulating layer formed in the cell region serves as an interlayer insulating layer configured to electrically separate the substrate 20 and a pipe gate PG, and the insulating layer formed in the peripheral circuit region serves as a gate insulating layer configured to separate the substrate 20 and a gate electrode G.

Next, a first conductive layer 22 is formed on the insulating layer 21. Here, the first conductive layer 22, formed in the cell region, is configured so as to form the pipe gate PG, and the first conductive layer 22 formed in the peripheral circuit region is configured so as to form the gate electrode G. The first conductive layer 22 is formed to have a second-type impurity. For example, the first conductive layer 22 is formed of a poly silicon layer including an N-type impurity, such as phosphorous (P) and arsenic (As).

Subsequently, a mask pattern 23, configured to define a trench region in which a pipe channel layer is to be formed, is formed on the first conductive layer 22. Here, the mask pattern 23 is formed in such a manner that a region in which a trench of the cell region is to be formed is left exposed, and the remaining regions including the peripheral circuit region is covered by the mask pattern 23.

Next, the trenches are formed by etching the first conductive layer 22 with the mask pattern 23 as the etching barrier. Then, insides of the trenches are doped with a first-type impurity with the mask pattern 23 remaining in place, and then mask pattern 23 is removed when the doping of the impurity is completed.

Here, the first-type impurity is different from the aforementioned second-type impurity, and when the second-type impurity is an N-type, the first-type impurity may be a P-type. For example, the P-type impurity, such as boron (B) may be used as a dopant, by using an ion implantation process or a plasma doping process. Especially, when the ion implantation process is used, the inner walls and lower surfaces of the trenches may be doped with the first-type impurity by a rotation implantation method or a tilt implantation method.

In this case, the mask pattern 23 serves as a barrier, only the inner surface of the trench is doped with the first-type impurity, and a top surface of the first conductive layer 22 is not doped with the first-type impurity. Especially, the first conductive layer of the peripheral circuit region is not doped with the first-type impurity.

Further, when using the first-type impurity as a dopant, the first-type impurity is used as a dopant in a concentration equal to or higher than a concentration offsetting the second-type impurity included in the first conductive layer 22. Through this, a first region 22A and a second region 22B are defined. The first region 22A may contact the trench and include the first-type impurity. The second region 22B may include the second-type impurity.

For reference, a dielectric layer (not shown) may be further formed on the first conductive layer 22 before the forming of the mask pattern 23. In this case, the trench may be formed by etching the dielectric layer and the substrate with the mask pattern 23 as the etching barrier. Then, after removing the mask pattern 23, the inner surface of the trench may be doped with the dielectric layer serving as a barrier. In this case, the dielectric layer is removed after the doping of the first-type impurity.

Figure 3A:
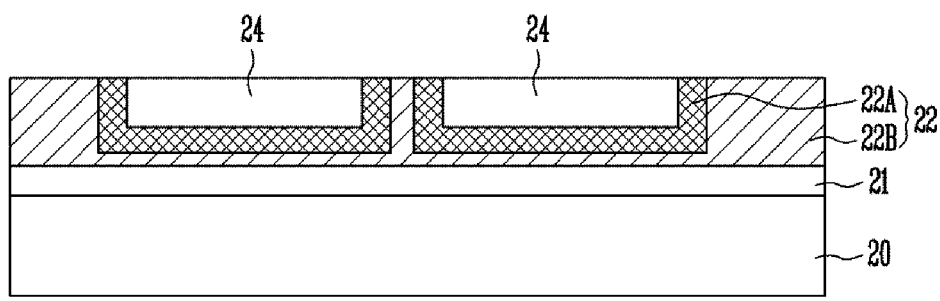
Figure 3B:
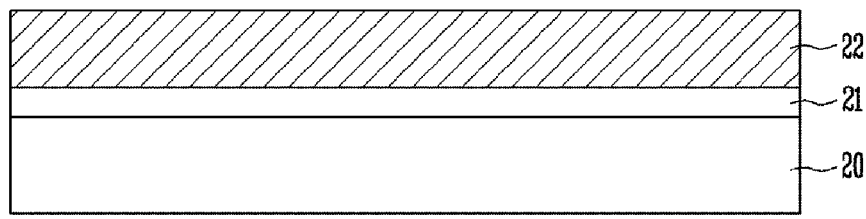

As illustrated in FIGS. 3A and 3B, a sacrificial layer 24 is formed on an entire structure of a product such that the trenches are buried and then a planarization process is performed until a surface of the first conductive layer 22 is exposed.

Accordingly, the first conductive layer 22 including the first region 22A, which includes the trench including the buried sacrificial layer 24, and includes the first-type impurity, and the remaining second region 22B including the second-type impurity is formed in the cell region. Further, the first conductive layer 22 including the second-type impurity is formed in the peripheral circuit region.

Figure 4A:
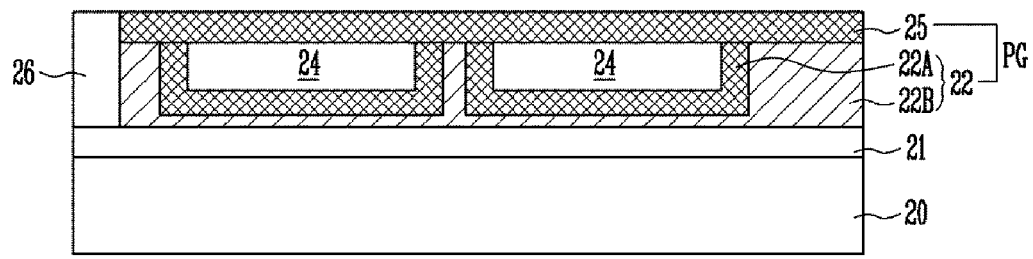
Figure 4B:
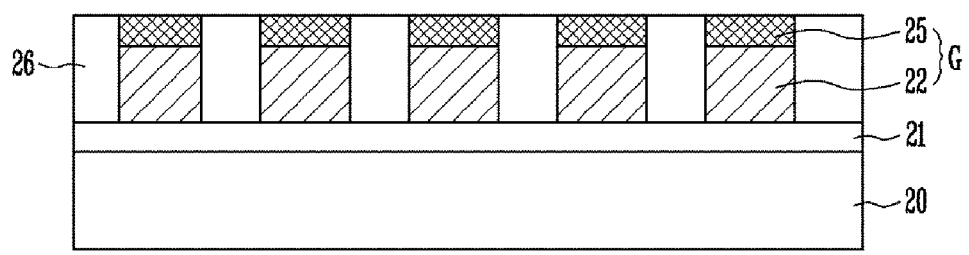

As illustrated in FIGS. 4A and 4B, a second conductive layer 25 is formed on the first conductive layer 22 in which the sacrificial layer 24 is buried. Here, the second conductive layer 25 may be formed to include the first-type impurity. For example, the second conductive layer 25 may be formed of the P-type poly silicon layer.

Next, the pipe gate PG positioned in the cell region and the gate electrode G positioned in the peripheral circuit region are formed by etching the second conductive layer 25 and the first conductive layer 22.

Here, the pipe gate PG is formed to include at least one trench. Each pipe gate PG has a structure in which the first conductive layer 22 including the first region 22A, which is in contact with the lower surface and a side surface of the trench and including the first-type impurity, and the second region 22B including the second type impurity and the second conductive layer 25 including the first-type impurity are stacked. Further, the gate electrode G has a structure in which the first conductive layer 22 including the second-type impurity and the second conductive layer 25 including the first-type impurity are stacked.

In some embodiments, the step of forming the second conductive layer 25 may be omitted. In this case, the pipe gate PG is formed of the first conductive layer 22 including the first region 22A, which is in contact with the lower surface and the side surface of the trench and including the first-type impurity, and the second region 22B including the second type impurity. The gate electrode G may be formed from the first conductive layer 22 including the second-type impurity.

Subsequently, an insulating layer 26 is formed in a region etched in the process of forming the pipe gate PG and the gate electrode G.

Figure 5A:
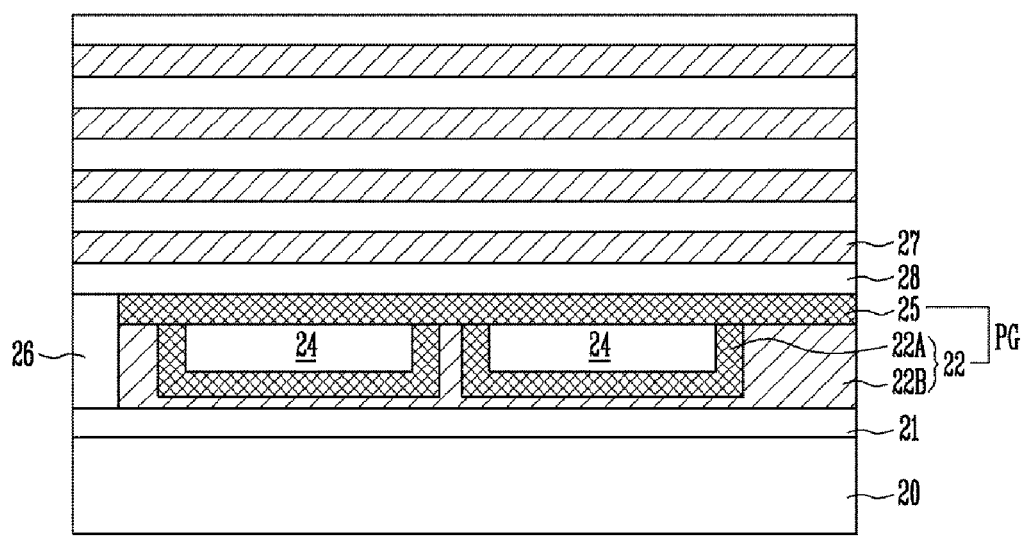
Figure 5B:
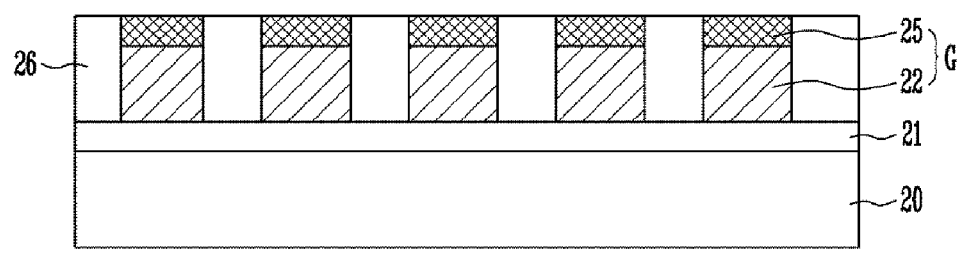

As illustrated in FIGS. 5A and 5B, first material layers 27 and second material layers 28 may be alternately formed on a product in which the pipe gate PG and the gate electrode G are formed. The first material layers 27 and the second material layers 28 may be formed only on the pipe gate PG in the cell region in a state where the peripheral circuit region is covered with a mask pattern (not shown), such as a photo resist layer. Further, the first material layers 27 and the second material layers 28 may also be formed on the peripheral circuit region.

Here, the first material layer 27 is formed so as to form the word line, the selection line, etc., and the second material layer 28 is formed so as to electrically insulate the stacked word line and select line. The first material layer 27 and the second material layer 28 are formed of a material having large etch selectivity. For example, the first material layer 27 may be formed of the conductive layer or the sacrificial layer, and the second material layer 28 may be formed of the interlayer insulating layer or the sacrificial layer.

For example, the first material layer 27 may be formed of the conductive layer, such as a poly silicon layer, and the second material layer 28 may be formed of the insulating layer, such as an oxide layer. For another example, the first material layer 27 may be formed of the conductive layer, such as a doped poly silicon layer and a doped amorphous silicon layer, and the second material layer 28 may be formed of the sacrificial layer, such as an undoped poly silicon layer, an updoped amorphous silicon layer. For another example, the first material layer 27 may be formed of the sacrificial layer, such as a nitride layer and the second material layer 28 may be formed of the insulating layer, such as an oxide layer.

Figure 6A:
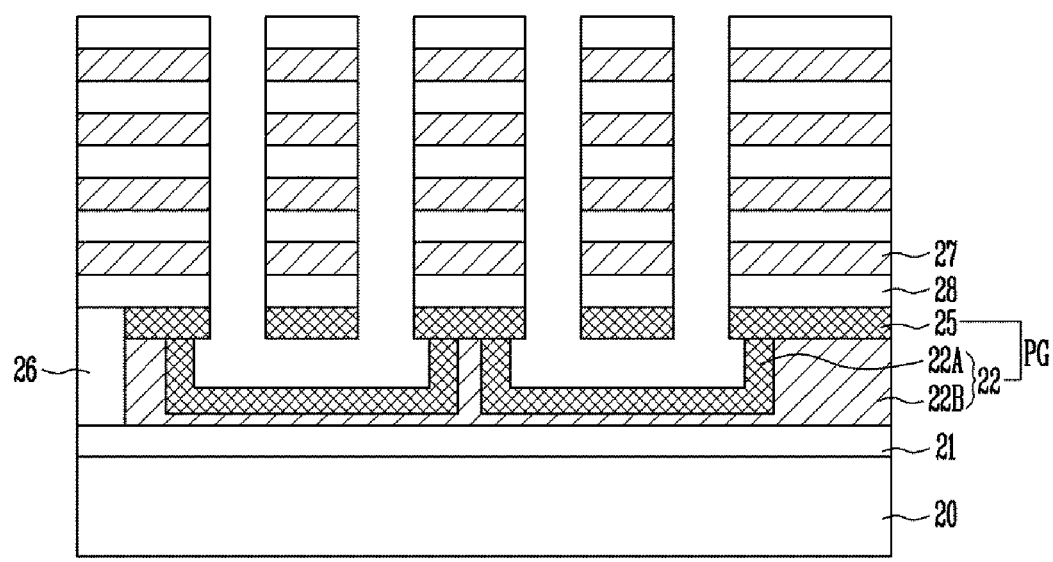
Figure 6B:
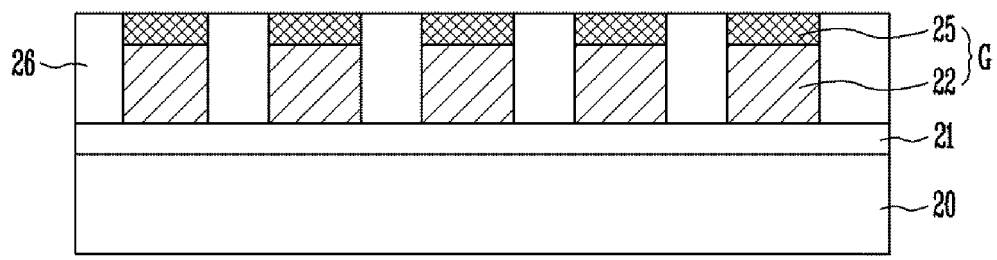

As illustrated in FIGS. 6A and 6B, channel holes are formed by etching the first material layers 27 and the second material layers 28. In this case, the channel holes are formed so as to be connected with the trenches. For example, the channel holes are formed in such a manner that each trench is connected with a pair of channel holes.

Next, the sacrificial layer 24 (see FIG. 3B, for example) exposed in lower surfaces of the channel holes is removed. Accordingly, the U-shaped trench including the pair of channel holes connected with the trench is formed.

Figure 7A:
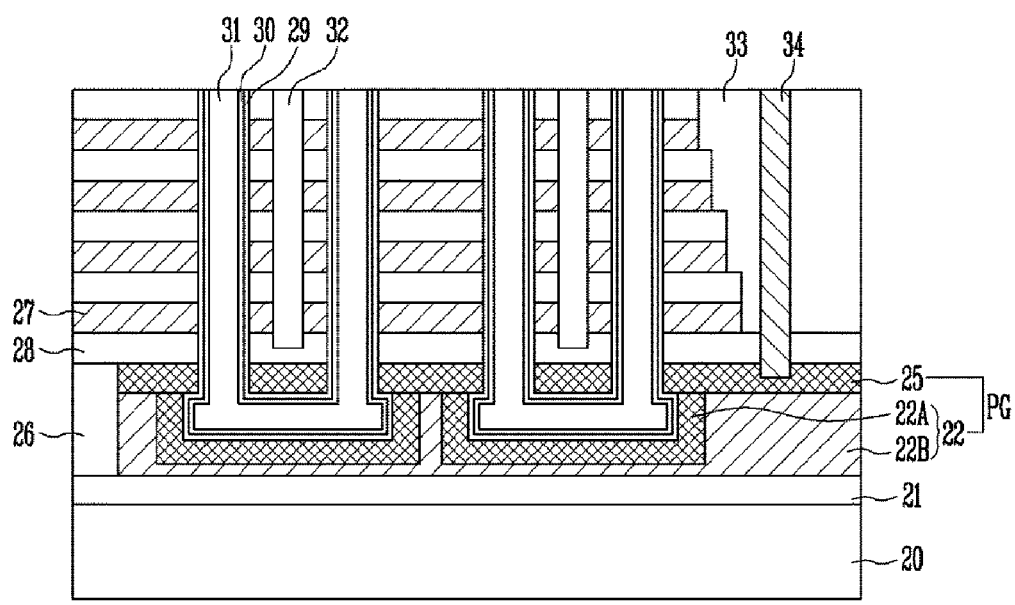
Figure 7B:
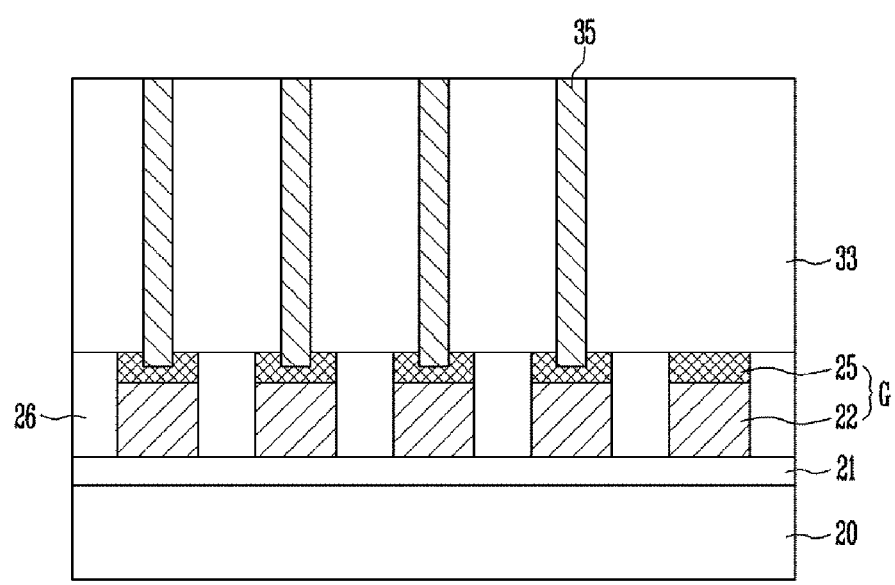

As illustrated in FIGS. 7A and 7B, a memory layer 29 is formed along an inner surface of the U-shaped trench. The memory layer 29 may be formed of a charge blocking layer, a charge trap layer, or a tunnel insulating layer. Here, the memory layer 29 formed within the trench is used as the gate insulating layer.

Subsequently, a channel layer 30 is formed on the memory layer 29. Here, the channel layer 30 formed within the trench is used as the pipe channel layer, and the channel layer 30 formed within the channel holes is used as the vertical channel layer. That is, the channel layer includes the vertical channel layers and the pipe channel layers configured to connect lower ends of the vertical channel layers. For example, the channel layer 30 may be formed of a semiconductor layer, such as a poly silicon layer.

In this case, the channel layer 30 may be formed so as to completely fill up to a center region of the U-shaped trench or to open the center region. When the center region is opened, the insulating layer 31 is filled in the opened center region. The insulating layer 31 may be formed of a fluidal insulating layer, such as polysilazane (PSZ) and Spin On Dielectric (SOD).

Next, slits (see, for example, reference character 32 denoting an insulating layer that may later fill the slits) positioned between the channel holes are formed by etching the first material layers 27 and the second material layers 28. Here, the slits may be formed in all spaces between the channel holes or may be formed in a part of the spaces between the channel holes. For example, when the slits are formed in all of the spaces between the channel holes, the adjacent strings have a structure in which source side word lines and drain side word lines are separated from each other. Further, when the slit is formed between a pair of vertical channel layers constituting one string, the adjacent strings have a structure in which the source side word lines and the drain side word lines are connected to each other.

Next, an insulating layer 32 is filled in the slits. In this case, depending on the materials of the first material layer 27 and the second material layer 28, an additional process may be performed before filling the insides of the slits with the insulating layer 32.

For example, when the first material layer 27 is formed of the conductive layer and the second material layer 28 is formed of the insulating layer, the insulating layer 32 is filled in the slits after processing the first material layers 27 exposed by the slits to be a silicide. Accordingly, the process of manufacturing the memory cell is completed.

In another example, when the first material layer is formed of the conductive layer and the second material layer 28 is formed of the sacrificial layer, the second material layer 28 exposed within the slit is removed. Next, the insulating layer 32 is filled in regions in which the second material layers 28 are removed and the insides of the slits. Accordingly, the process of manufacturing the memory cell is completed.

In another example, when the first material layer is formed of the sacrificial layer and the second material layer 28 is formed of the insulating layer, the first material layers 27 exposed within the slits are removed. Next, the charge blocking layer, such as an aluminum oxide layer ($Al_2O_3$), is additionally formed within the regions in which the first material layers 27 are removed, and then the regions are filled with the conductive layer, such as tungsten (W), to form the word line, the selection line, etc. In this case, prior to the additional forming of the charge blocking layer, the charge blocking layer within the channel holes damaged in the process of removing the first material layers 27. Next, the insulating layer 32 is filled in the slits. Accordingly, the process of manufacturing the memory cell is completed.

Next, the first material layers 27 and the second material layers 28 are patterned in a step shape in a manner that a contact pad is formed in every first material layer 27 of each layer. Subsequently, the interlayer insulating layer 33 is formed on an entire structure of a product. Here, the interlayer insulating layer 33 is formed in the cell region and the peripheral circuit region.

Next, a first contact hole for exposing the pipe gate PG and second contact holes for exposing the gate electrodes G are formed by etching the interlayer insulating layer 33. In this case, although it is not illustrated in the drawing, third contact holes connected to the contact pads of the first material layers 27 of the respective layers may be formed together in a pad region in which the first material layers 27 and the second material layers 28 are patterned in a step shape. Further, depending on the type of the transistor formed in the peripheral circuit region, the second contact hole may be formed only in the partial transistor.

Next, the conductive layer is formed within the first contact hole and the second contact holes and a first contact plug 34 connected to the second conductive layer 25 of the pipe gate PG and a second contact plug 35 connected to the second conductive layer 25 of the gate electrodes G are formed. For example, a barrier layer including titanium (Ti), titanium nitride (TiN), etc., is formed within the first contact hole and the second contact holes, and then the first and second contact plugs 34 and 35 are formed by filling the conductive layer with a material, such as tungsten (W). In this case, third contact plus (not shown) may also be formed within the third contact holes.

As described above, according to the first example embodiment of the present invention, the pipe gate PG having the hybrid structure having different work functions depending on the region in which the structure may be formed. For example, the P-type poly silicon layer having a relatively large work function is formed in the first region 22A surrounding the lower surface and the side surface of the pipe channel layer, and the pipe gate PG including the first conductive layer 22 formed of the N-type poly silicon layer having a relatively small work function and the second conductive layer 25 which is in contact with the top surface of the pipe channel layer and is formed of the P-type poly silicon layer having a relatively large work function may be formed in the remaining second region 22B. Accordingly, it is possible to prevent trapping of a charge in the gate insulating layer in the erase operation and improve the cell current flow in the pipe channel, thereby being capable of improving characteristics of the memory device.

Figure 8A:
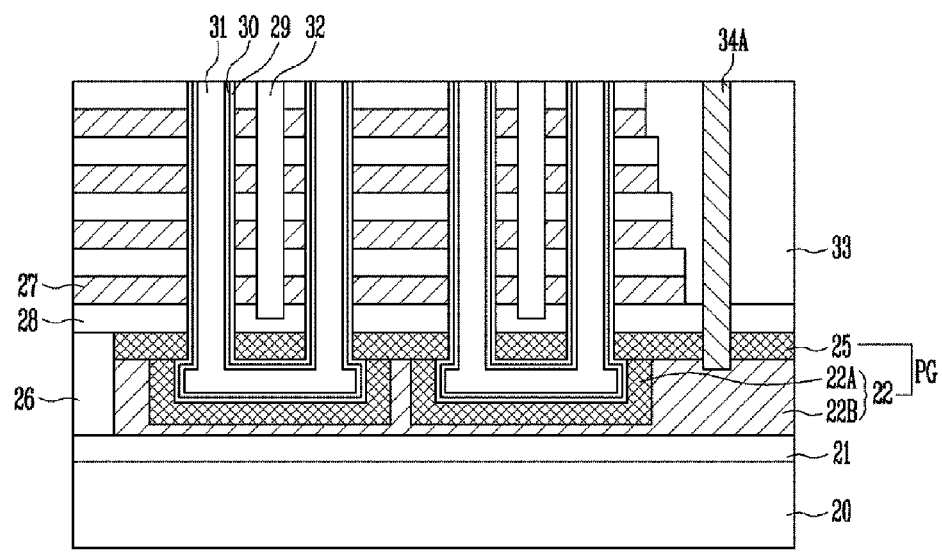
FIGS. 8A to 8B are cross-sectional views illustrating a semiconductor device according to a second embodiment of the present invention.
Figure 8B:
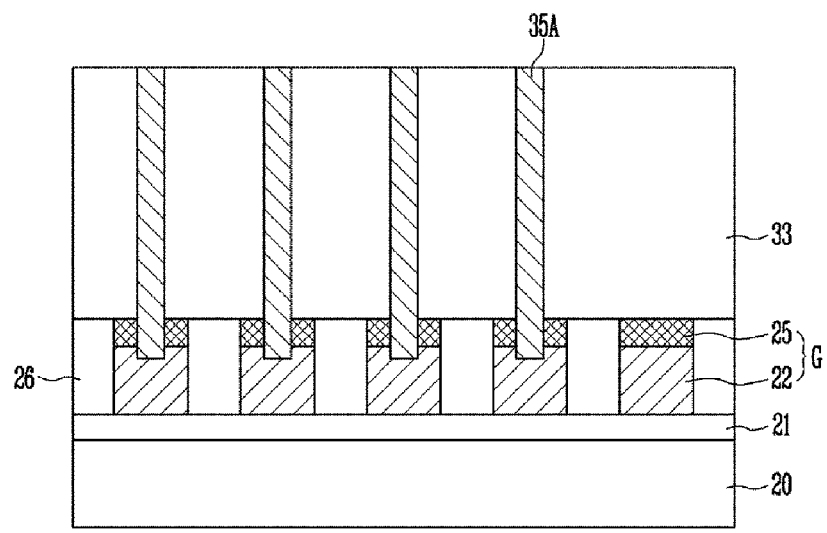

FIGS. 8A to 8B are cross-sectional views illustrating a semiconductor device according to a second embodiment of the present invention. FIG. 8A is a cross-sectional view illustrating the cell region and the FIG. 8B is a cross-sectional view illustrating the peripheral circuit region.

The semiconductor device according to the second embodiment of the present invention includes a first contact plug 34A connected to the second region 22B of the first conductive layer 22 of the pipe gate PG and a second contact plug 35A connected to the first conductive layer 22 of the gate electrode G.

For example, a first contact hole and second contact holes are formed by etching the interlayer insulating layer 33 and the second conductive layer 25. The first contact hole may be configured to expose the second region 22B of the first conductive layer 22. The second contact holes may be configured to expose the first conductive layer 22 in the peripheral circuit region. Next, a first contact plug 34A and second contact plugs 35A may be formed by forming an insulating spacer in inner walls of the first and second contact holes and then forming the conductive layer. In this case, before the forming of the first contact plug 34A and the second contact plugs 35A, contact resistance may be improved by additionally doping the second-type impurity in the first conductive layer 22B and 22 exposed in the lower surfaces of the first and second contact holes.

Other structures are substantially the same as those of the device aforementioned in the first embodiment, so the repeated description will be omitted.

Figure 9:
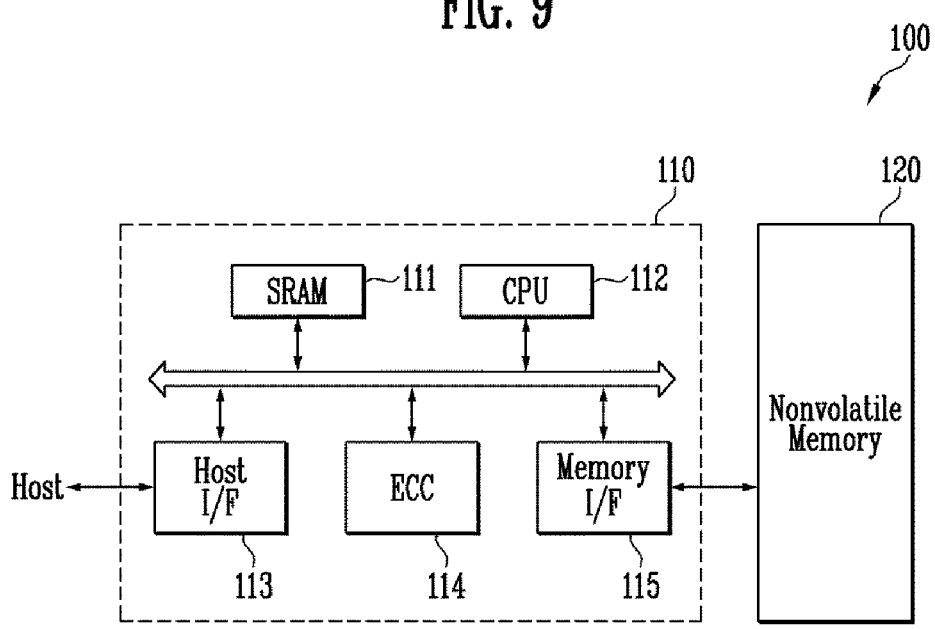
FIG. 9 is a diagram illustrating a construction of a memory system that may include an embodiment of the present invention.

FIG. 9 is a diagram illustrating a construction of a memory system that may include of the present invention.

As illustrated in FIG. 9, the memory system that may include the present invention includes a non-volatile memory device 120 and a memory controller 110.

The non-volatile memory device 120 is configured to have a cell array including the pipe gate having the hybrid structure aforementioned in the first and second embodiments. Further, the non-volatile memory device 120 may be a multi-chip package including a plurality of flash memory chips.

The memory controller 110 is configured so as to control the nonvolatile memory device 120, and may include an SRAM 111, a CPU 112, a host interface 113, an ECC 114, and a memory interface 115. The SRAM 111 is used as an operation memory of the CPU 112, the CPU 112 performs a general control operation for data exchange of the memory controller 110, and the host interface 113 includes a data exchange protocol of a host accessing the memory system 100. Further, the ECC 114 detects and corrects an error included in data read from the nonvolatile memory device 120, and the memory interface 115 performs interfacing with the nonvolatile memory device 120. In addition, the memory controller 110 may further include an RCM, etc., for storing code data for interfacing with the host.

As such, the memory system 100 having the aforementioned construction may be a memory card or a Solid State Disk (SSD) in which the nonvolatile memory device 120 is combined with the memory controller 110. For example, when the memory system 100 is the SSD, the memory controller 110 may communicate with the outside (e.g., the host) through one among various interface protocols, such as USB, MMC, PCI-E, SATA, PATA, SCSI, ESDI, and IDE.

Figure 10:
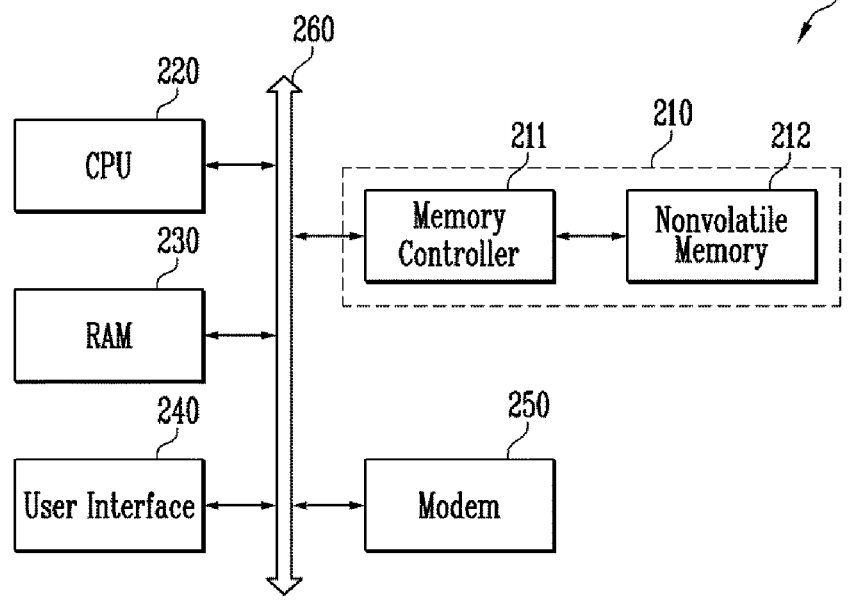
FIG. 10 is a diagram illustrating a construction of a computing system that may include an embodiment of the present invention.

FIG. 10 is a diagram illustrating a construction of a computing system that may include an embodiment the present invention.

As illustrated in FIG. 10, the computing system 200 that may include the present invention may include a CPU 220 electrically connected to a system bus 260, an RAM 230, a user interface 240, a modem 250, and a memory system 210. Further, when the computing system 200 is a mobile device, the computing system 200 may further include a battery configured to supply an operation voltage to the computing system 200, and may further include an application chipset, a Camera Image Processor (CIS), a mobile DRAM, and the like.

The memory system 210 may be configured with the nonvolatile memory 212 and the memory controller 211 as described with reference to FIG. 9.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims.

What is claimed is:
1. A semiconductor device comprising:
vertical channel layers;
a pipe channel layer configured to connect lower ends of the vertical channel layers; and
a pipe gate surrounding the pipe channel layer and including a first conductive layer and a second conductive layer,
wherein the first conductive layer includes a first region contacting a lower surface and a side surface of the pipe channel layer and remaining second regions, wherein the first region includes a first-type impurity, and the remaining second regions include a second-type impurity different from the first-type impurity,
the second conductive layer formed on the first conductive layer and including the first-type impurity, and
the vertical channel layers pass through the second conductive layer.
2. The semiconductor device of claim 1, wherein the first conductive layer is formed of a poly silicon layer, the first region includes a P-type impurity, and the remaining second regions include an N-type impurity; and
wherein the second conductive layer is formed of a poly silicon layer including the P-type impurity.
3. The semiconductor device of claim 1, further comprising a first contact plug connected to the second conductive layer.
4. The semiconductor device of claim 1, further comprising a first contact plug passing through the second conductive layer and directly connected to the remaining second regions of the first conductive layer.

5. The semiconductor device of claim 1, further comprising:
   a gate insulating layer formed on a substrate; and
   a gate electrode formed on the gate insulating layer and including a first conductive layer and a second conductive layer stacked on the first conductive layer, wherein the first conductive layer includes the second-type impurity and the second conductive layer includes the first-type impurity.

6. The semiconductor device of claim 5, further comprising a second contact plug connected to the second conductive layer of the gate electrode.

7. The semiconductor device of claim 5, further comprising a second contact plug passing through the second conductive layer of the gate electrode and directly connected to the first conductive layer of the gate electrode.

8. The semiconductor device of claim 5, wherein the first conductive layer is formed of an N-type poly silicon layer and the second conductive layer is formed of a P-type poly silicon layer.

9. The semiconductor device of claim 5, wherein the first conductive layer of the gate electrode directly contacts the second conductive layer of the gate electrode.

10. A semiconductor device comprising:
    a pipe gate;
    word lines stacked on the pipe gate; and
    pipe channel layers formed in the pipe gate,
    wherein the pipe gate includes first regions, which surround the pipe channel layer and include a first-type impurity, and remaining second regions including a second-type impurity different from the first type impurity, and
    the first regions directly contact the remaining second regions.

11. The semiconductor device of claim 10, wherein the first regions are defined to surround the pipe channel layers, respectively, and the remaining second regions are defined between neighbored pipe channels and under the pipe channels to surround the first regions and isolate the first regions from each other.

12. The semiconductor device of claim 1, further comprising:
    a memory layer surrounding the vertical channel layers and the pipe channel layer.

13. The semiconductor device of claim 1, wherein the second conductive layer contacts the memory formed on a top surface of the pipe channel layer.

* * * * *